US012588394B2

(12) United States Patent
Cha et al.

(10) Patent No.: US 12,588,394 B2
(45) Date of Patent: Mar. 24, 2026

(54) DISPLAY DEVICE

(71) Applicant: LG Display Co., Ltd., Seoul (KR)

(72) Inventors: Jongseok Cha, Goyang-si (KR);
DongWon Jang, Goyang-si (KR)

(73) Assignee: LG Display Co., Ltd., Seoul (KR)

( * ) Notice: Subject to any disclaimer, the term of this
patent is extended or adjusted under 35
U.S.C. 154(b) by 519 days.

(21) Appl. No.: 18/058,523

(22) Filed: Nov. 23, 2022

(65) Prior Publication Data

US 2023/0209890 A1 Jun. 29, 2023

(30) Foreign Application Priority Data

Dec. 29, 2021 (KR) ........................ 10-2021-0190852

(51) Int. Cl.
| | |
|---|---|
| *H10K 59/80* | (2023.01) |
| *B32B 3/26* | (2006.01) |
| *B32B 7/12* | (2006.01) |
| *H10K 77/10* | (2023.01) |
| *H10K 102/00* | (2023.01) |
| *B32B 5/18* | (2006.01) |

(Continued)

(52) U.S. Cl.
CPC .......... *H10K 59/873* (2023.02); *B32B 3/266*
(2013.01); *B32B 7/12* (2013.01); *H10K*
*59/8794* (2023.02); *H10K 77/111* (2023.02);
*B32B 5/18* (2013.01); *B32B 15/046* (2013.01);
*B32B 15/08* (2013.01); *B32B 15/20* (2013.01);
*B32B 17/06* (2013.01); *B32B 17/061*
(2013.01); *B32B 17/10* (2013.01); *B32B*
*2266/045* (2013.01); *B32B 2457/20* (2013.01);
*H10K 2102/311* (2023.02)

(58) Field of Classification Search
CPC .... B32B 3/02–06; B32B 2457/20–206; H10K
50/844; H10K 50/87; H10K 59/8794;
H10K 59/873–8731; H10K 77/111
See application file for complete search history.

(56) References Cited

U.S. PATENT DOCUMENTS

| | | | | |
|---|---|---|---|---|
| 10,600,341 | B2 * | 3/2020 | Kang | ................. H05K 7/20963 |
| 2019/0081255 | A1 * | 3/2019 | Kim | ........................ B32B 15/08 |
| 2023/0020481 | A1 * | 1/2023 | Qin | ........................ H10H 20/01 |

FOREIGN PATENT DOCUMENTS

| | | |
|---|---|---|
| CN | 102903703 A | 1/2013 |
| CN | 107946263 A | 4/2018 |

(Continued)

*Primary Examiner* — Mariceli Santiago
(74) *Attorney, Agent, or Firm* — Seed Intellectual
Property Law Group LLP

(57) ABSTRACT

An embodiment of the present disclosure provides a display
device including a front member disposed on a front surface
of a display panel and having curved areas and a planar area,
a second adhesive layer disposed on a rear surface of the
display panel, a first member disposed on the second adhe-
sive layer, a second member disposed on the first member,
a heat dissipation member disposed on the second member
and having a width different from that of the front member,
an encapsulation member encapsulating the heat dissipation
member and including a first region and a second region and
a third adhesive layer disposed on the heat dissipation
member, wherein the curved areas are located at both ends
of the front member along a width direction of the front
member, wherein a width of the encapsulation member is
less than or equal to a width of the front member.

17 Claims, 8 Drawing Sheets

(51) Int. Cl.

| | | |
|---|---|---|
| *B32B 15/04* | (2006.01) | |
| *B32B 15/08* | (2006.01) | |
| *B32B 15/20* | (2006.01) | |
| *B32B 17/06* | (2006.01) | |
| *B32B 17/10* | (2006.01) | |

(56)                    References Cited

FOREIGN PATENT DOCUMENTS

| | | | | |
|---|---|---|---|---|
| CN | 112309251 A | * | 2/2021 | ......... H10K 59/8794 |
| CN | 112736112 A | | 4/2021 | |
| JP | 2007044994 A | | 2/2007 | |
| KR | 20130096957 A | | 9/2013 | |
| KR | 1020170020700 A | | 2/2017 | |
| KR | 20200129646 A | | 11/2020 | |
| KR | 20210016223 A | | 2/2021 | |
| KR | 20210083970 A | * | 7/2021 | ........... H05K 9/0081 |
| KR | 1020210083970 A | | 7/2021 | |

* cited by examiner (a)          (b)          (c)

(d)          (e)          (f)

DISPLAY DEVICE

CROSS-REFERENCE TO RELATED APPLICATIONS

This application claims the benefit of and priority to Korean Patent Application No. 10-2021-0190852 filed on Dec. 29, 2021 in the Republic of Korea, the entire contents of which are hereby expressly incorporated by reference into the present application.

BACKGROUND

Technical Field

The present disclosure relates to a display device, and more particularly, to a display device allowing for an improvement in a heat dissipation function.

Description of the Related Art

Display devices are used in a wide variety of forms and methods, in televisions, monitors, smart phones, tablet PCs, laptop computers, wearable devices and the like. Among display devices used in various forms and methods, there is an organic light emitting display device (OLED device) or the like.

An organic light emitting display device includes a self-emissive element in which the element itself is a light emitting body, and thus does not require a separate light source, so that it can be bent or implement a display device having various designs. In addition, an organic light emitting display device allows for manufacture of a display thinner than a liquid crystal display (LCD), and has advantages of excellent color realization, viewing angle and contrast ratio, and fast response speed, so that it allows for manufacture of a display for realizing a high-definition video, and thus, a range of its use is gradually increasing.

The organic light emitting display device includes an active area for displaying a screen and a non-active area formed along an outer portion of the active area. In the non-active area, additional components may be located, or various connection components such as a flexible circuit board for connecting the additional components may be located.

Recently, display devices with a curved surface to increase a viewer's immersion and tension, or to provide a wide screen are being developed.

BRIEF SUMMARY

A thickness and width of the display device may increase as the plurality of additional components are positioned. Inventors recognize that as the thickness and width of the display device increase, there are also disadvantages in terms of design and portability.

In addition, when the display device is driven, heat may be generated in a driving integrated circuit and the like. Accordingly, a heat dissipation layer may be provided on a rear surface of a display panel in order to radiate (or dissipate) heat from the driving integrated circuit and the like.

In order to effectively dissipate heat from a driving integrated circuit, a thickness of a heat dissipation layer may be increased, but a total thickness of a display device increases by the thickness of the heat dissipation layer that is added, and thus a bezel area may increase.

In addition, after a process of manufacturing or bending a display panel is performed, since it is difficult to additionally bond a heat dissipation layer during the process, effective heat dissipation for the driving integrated circuit may be difficult.

Accordingly, the inventors of the present disclosure have conducted several experiments allowing for an improvement in heat dissipation performance without an increase in a thickness of a display device. Through various experiments, a display device having a new structure capable of improving heat dissipation characteristics without an increase in the thickness of the display device has been invented.

An aspect of the present disclosure provides a display device capable of maintaining rigidity without an increase in an overall thickness of the display device and improving heat dissipation performance.

A display device according to an embodiment of the present disclosure includes a second adhesive layer disposed on a rear surface of the display panel, a first member disposed on the second adhesive layer, a second member disposed on the first member, a heat dissipation member disposed on the second member and having a width different from that of the front member, an encapsulation member encapsulating the heat dissipation member and including a first region and a second region and a third adhesive layer disposed on the heat dissipation member, wherein the curved areas are located at both ends of the front member along a width direction of the front member, wherein a width of the encapsulation member may be less than or equal to a width of the front member.

A display device according to an embodiment of the present disclosure includes a front member having a curved area and a planar area, a first adhesive layer disposed on a rear surface of the front member, a display panel disposed on the first adhesive layer, a second adhesive layer disposed on the display panel, a first heat dissipation layer disposed on the second adhesive layer and including a metal, a first cushioning layer disposed on the first heat dissipation layer, a second heat dissipation layer disposed on the first cushioning layer and having a width different from that of the front member, an encapsulation layer having an encapsulation portion that encapsulates an entire surface of the second heat dissipation layer and a wing portion and a third adhesive layer disposed on the second heat dissipation layer, wherein the first cushioning layer and the third adhesive layer may be in contact with each other through a plurality of holes formed in the wing portion of the encapsulation layer.

According to embodiments of the present disclosure, since a heat dissipation member is disposed in a display device having a curved area and a planar area and an adhesive structure of the heat dissipation member is formed in the curved area, heat dissipation performance can be improved without an increase in an overall thickness of a display device.

According to embodiments of the present disclosure, by forming a structure using an adhesive layer having a higher adhesive strength than that of an encapsulation member that encapsulates the heat dissipation member, adhesive performance of the heat dissipation member can be improved.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are illustrative and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate aspects and embodiments of the disclosure and together with the description serve to explain the principles of the disclosure.

DETAILED DESCRIPTION

Figure 1:
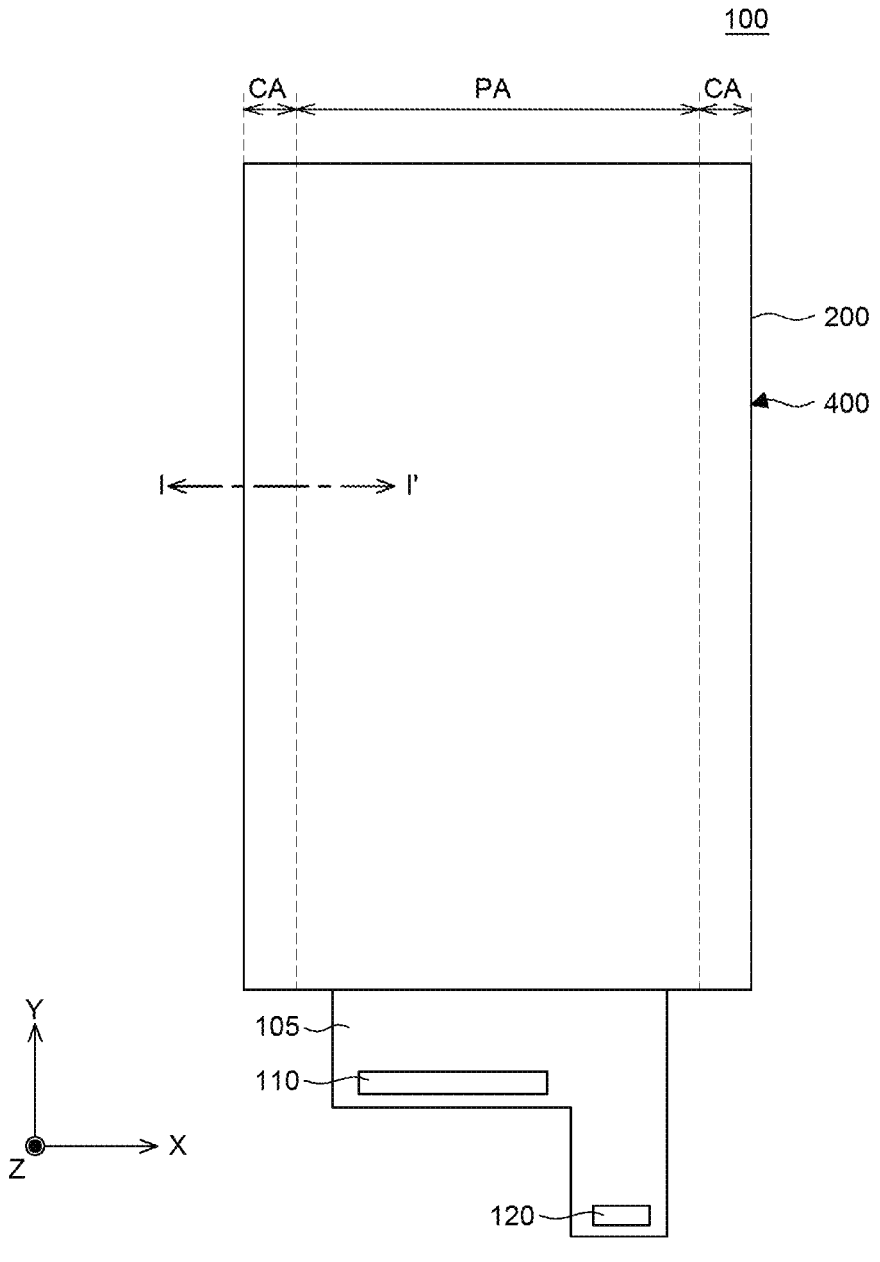
FIG. 1 is a plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next,"

one or more parts may be positioned between the two parts unless the terms are used with the term "immediately" or "directly."

In describing a time relationship, for example, when a temporal order is described as 'after~,' 'subsequent~,' 'next~,' and 'before~,' a case which is not continuous may be included unless 'just' or 'direct' is used.

It will be understood that, although terms "first," "second," and the like may be used herein to describe various elements, these elements should not be limited by these terms. These terms are only used to distinguish one element from another element. Thus, a first element mentioned below may be a second element within the technical idea of the present disclosure.

Features of various embodiments of the present disclosure may be partially or overall coupled to or combined with each other and may be variously inter-operated with each other and driven technically, and respective embodiments of the present disclosure may be carried out independently from each other, or may be carried out together in co-dependent relationship.

In the present disclosure, "display devices" may include narrow-sense display devices, such as a liquid crystal module (LCM), an organic light emitting module (an OLED module), and a quantum dot module (a QD module) that include a display panel and a driving unit for driving the display panel. Also, the display devices may include a set device (or a set apparatus) or a set electronic apparatus such as a notebook computer, a TV, a computer monitor, an equipment display apparatus including an automotive display apparatus or another type apparatus for vehicles, or a mobile electronic apparatus such as a smartphone or an electronic pad, which is a complete product (or a final product) including an LCM, an OLED module, or a QD module.

Therefore, the display devices of the present disclosure may include a narrow-sense display device itself, such as an LCM, an OLED module or a QD module, and a set device which is a final consumer device or an application product including an LCM, an OLED module, or a QD module.

In addition, in some cases, an LCM, an OLED module and a QD module including a display panel and a driving unit may be referred to as narrow-sense "display devices," and electronic devices as complete products including an LCM, an OLED module, and a QD module may be referred to as "set devices," for illustrative purposes only. For example, the narrow-sense display device may include an LCD, OLED or QD display panel and a source printed circuit board (PCB) which is a controller for driving the display panel. The set device may further include a set PCB which is a set controller electrically connected to the source PCB to control the set device overall.

As a display panel used in the present embodiment, all types of display panels such as liquid crystal display panels, organic light emitting diode (OLED) display panels, quantum dot (QD) display panels, electroluminescent display panels, and the like may be used. And, the display panel used in the present embodiment is not limited to a specific display panel capable of bezel bending with a flexible substrate for the OLED display panel and a lower back plate support structure. In addition, it is not limited to a shape or size of the display panel used in the display device according to an embodiment of the present disclosure.

For example, when the display panel is an OLED display panel, it may include a plurality of gate lines and data lines, and pixels formed at intersections of the gate lines and the data lines. In addition, the display panel may be configured to include an array including a thin film transistor, which is an element for selectively applying a voltage to each pixel, an organic light emitting diode (OLED) layer on the array, and an encapsulation substrate or an encapsulation layer disposed on the array to cover the organic light emitting diode layer and the like. The encapsulation layer may protect the thin film transistor and the organic light emitting diode layer and the like from external impacts and prevent penetration of moisture or oxygen into the organic light emitting diode layer. In addition, the layer formed on the array may include an inorganic light emitting layer, for example, a nano-sized material layer or quantum dots.

Hereinafter, various configurations of a display device allowing for an improvement in heat dissipation effects without an increase in an overall thickness will be described in detail.

Figure 2:
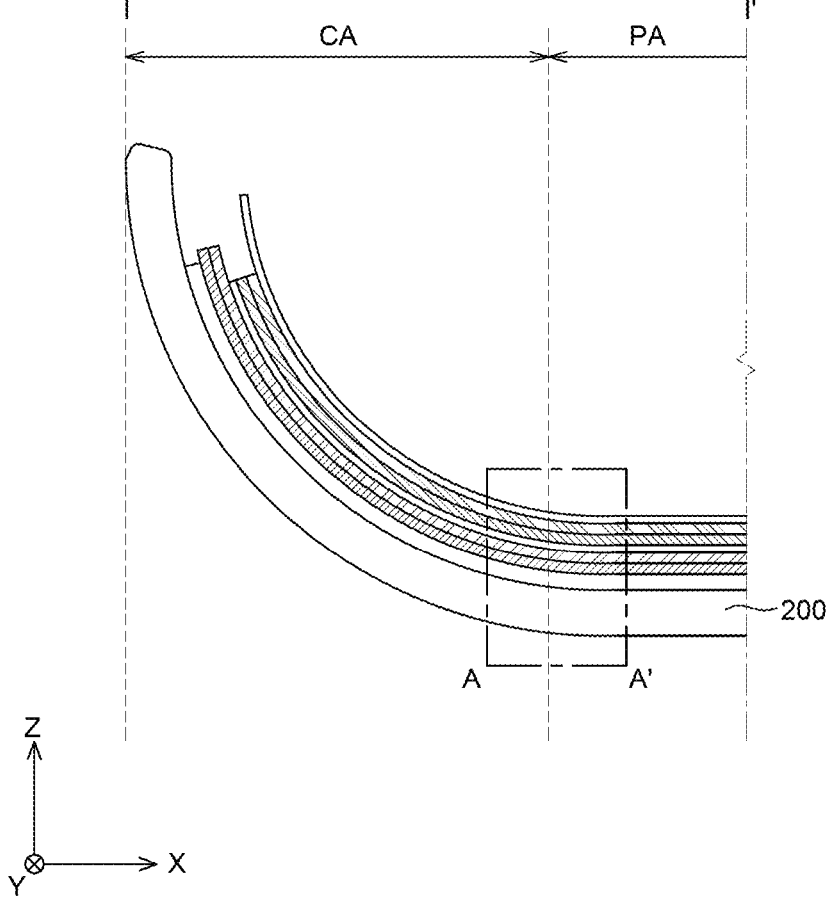
FIG. 2 is a cross-sectional view taken along cutting line I-I' of FIG. 1.
Figure 3:
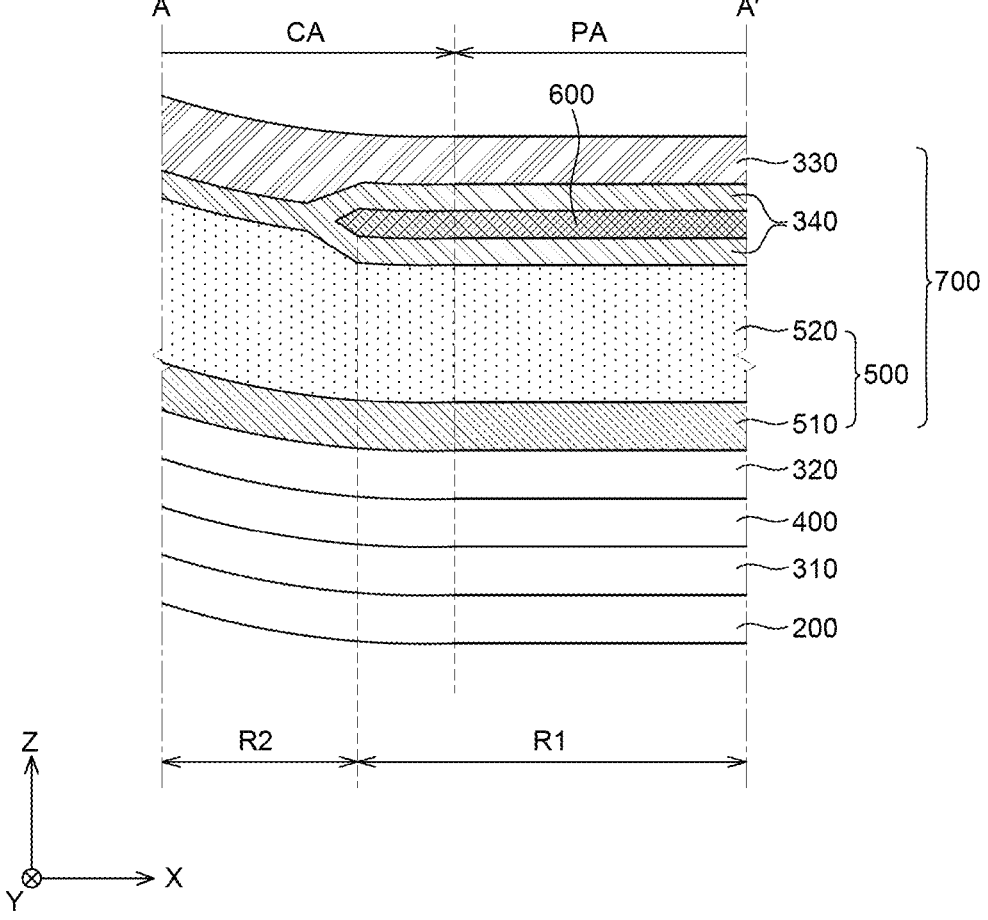
FIG. 3 is an enlarged view of cross-section A-A' of FIG. 2.

FIG. 1 is a plan view of a display device according to an embodiment of the present disclosure. FIG. 2 is a cross-sectional view taken along cutting line I-I' of FIG. 1. FIG. 3 is an enlarged view of cross-section A-A' of FIG. 2. A rear direction and an upper direction referred to herein may be a Z-axis direction, and a front direction and a lower direction may be a −Z-axis direction. For example, FIG. 1 shows a front surface of a display device 100.

With reference to FIGS. 1 to 3, the display device 100 may be configured to include a front member 200, a display panel 400, and a heat dissipation structure 700.

The front member 200 may be attached to a front surface of the display panel 400. For example, the front member 200 may be bonded to the display panel 400 by a first adhesive layer 310.

The display panel 400 may include a display substrate formed of plastic, such as a polymer or polyimide (PI), or glass. The display panel 400 may include an active area displaying an image and a non-active area. A plurality of sub-pixels for displaying an image and a driving circuit unit for driving the plurality of sub-pixels may be disposed in the active area. A pixel array unit may include the plurality of sub-pixels and the driving circuit unit. The non-active area is formed to surround the active area, and may be an area in which an image is not displayed.

A bezel may be a non-active area surrounding the active area in a display device product to which the display device 100 is applied. The non-active area and the bezel of the display device 100 may be the same area. A circuit board 105, a driving integrated circuit 110, and a connector 120 connected to an external device may be disposed in the non-active area. The connector 120 may be a current connector, but is not limited to the term.

According to an embodiment of the present disclosure, a chip on film (COF) in which the driving integrated circuit 110 is directly mounted on the display panel 400 may be applied, but the present disclosure is not limited thereto. The circuit board 105 may be a flexible printed circuit board (FPCB), and the circuit board 105 may be directly mounted or attached to the display panel 400.

One side (or end) of the circuit board 105 may be attached to the non-active area of the display panel 400, and the other side (or end) of the circuit board 105 may be bent toward a rear surface of the display panel 400 and thus these structure may allow for a reduction of the non-active area of the display panel 400 that is viewed from a front. In addition, an end of the display panel 400 on which the circuit board 105 is mounted may be also bent to some extent together with the circuit board 105 subsequently, so that the non-active area of the display panel 400 viewed from the front may be further reduced.

According to an embodiment of the present disclosure, one side (or end) of the display panel 400 may be bent toward the rear surface of the display panel 400 in order to reduce the non-active area of the display panel 400 viewed from the front maximally. Based on the extent in which the circuit board 105 is bent, the driving integrated circuit 110 may be disposed on a rear surface of the display substrate.

As a radius of curvature at which the display panel 400 or the circuit board 105 is bent increases, the non-active area of the display panel 400 that is viewed from the front increases. So, if an overall thickness of the display device 100 is reduced, the radius of curvature of the circuit board 105 may be formed to be small.

A pixel array unit including a thin film transistor layer and light emitting elements may be disposed on the display panel 400. The pixel array unit includes the plurality of sub-pixels. Each of the plurality of sub-pixels may be an individual unit emitting light, and the light emitting element may be disposed in each of the plurality of sub-pixels.

The driving integrated circuit 110 generates a data signal and a gate control signal based on image data and timing synchronization signals supplied from an external host driving system. In addition, the driving integrated circuit 110 may supply a data signal to data lines of each pixel through a display pad unit, and may supply a gate control signal to a gate driving circuit unit.

Various mechanisms are used to help the driving integrated circuit 110 to dissipate heat effectively. For example, heat in the display panel 400 and the driving integrated circuit 110 may be effectively dissipated by a first heat dissipation structure 500 or a second heat dissipation structure 700.

The first heat dissipation structure 500 and the second heat dissipation structure 700 are positioned between the display panel 400 and the driving integrated circuit 110 and may effectively dissipate heat generated from the display panel 400 as well as the driving integrated circuit 110. The first heat dissipation structure 500 and the second heat dissipation structure 700 may be a cushion plate, a heat dissipation layer, or the like, and are not limited to the terms. For example, the second heat dissipation structure 700 may be an extended heat dissipation structure, and is not limited to the term.

The first heat dissipation structure 500 may be configured to include a first member or a first heat dissipation layer 510 and a second member or a first cushioning layer 520. The second heat dissipation structure 700 may be configured to further include a heat dissipation member or a second heat dissipation layer 600 on the first heat dissipation structure 500. For example, the first member 510, the second member 520, and the heat dissipation member 600 may be sequentially stacked in a rear surface direction of the display device 100.

The first member (or the first heat dissipation layer) 510 may be disposed on the display panel 400. The first member 510 may be disposed under the display substrate constituting the display panel 400 and supplement rigidity of the display substrate. The first member 510 may be formed to have a certain strength and thickness in order to supplement the rigidity of the display substrate. The first member 510 may be a back plate, a support layer, a heat dissipation member, a rigid member or the like, but is not limited to the term.

The first member (or the first heat dissipation layer) 510 may transfer heat generated from the display panel 400 upwardly. The first member 510 may absorb heat generated from the display panel 400 and transfer the heat to other mediums. The first member 510 may be formed of a material having high thermal conductivity or high heat dissipation efficiency. For example, the first member 510 may be a metal layer including copper, but is not limited to such a material.

A second adhesive layer 320 may be disposed between the display panel 400 and the first member 510. The second adhesive layer 320 may bond the display panel 400 and the first member 510 to each other. The second adhesive layer 320 may transfer heat generated from the display panel 400 to the first member 510.

The second member (or the first cushioning layer) 520 may be disposed on the first member 510. The second member 520 may have a heat dissipation function and an impact absorption function. The second member 520 may receive heat generated in the display panel 400 from the first member 510 and transfer it to other mediums. The second member 520 may absorb an external impact applied to a display device 100 and reduce the impact transmitted to the display panel 400. The second member 520 may be a cushioning layer, a foam layer, or an impact absorbing layer, but is not limited thereto. For example, the second member 520 may be a foam having a plurality of bubbles therein, and may be formed as a urethane foam, but the present disclosure is not limited thereto. For example, the second member 520 may have a thickness greater than the first member 510.

The second member 520 may be formed of a metal having a multi-pore shape. For example, the second member 520 may be a metal foam or a flexible conductive film (FCF), but is not limited to the term. A material of the second member 520 may be formed of metal, but is not limited thereto. For example, the second member 520 may be formed of copper (Cu), which has high thermal conductivity and is easy to manufacture a multi-pore shape or porous shape.

In embodiments that the second member 520 is formed of a metal having a multi-pore shape, it has a weight lighter than that of the same metal without a multi-pore shape. In embodiments that the second member 520 has a soft property, workability thereof such as cutting or bending may be facilitated. In addition, in embodiments that the second member 520 has a multi-pore shape, a surface area thereof in contact with air is increased, so that it can have an advantage in dissipating heat.

The second member 520 may have a thickness greater than that of the first member 510. For example, the second member 520 may absorb an external impact to the display device 400 and reduce the impact transmitted to the display panel 400. An adhesive layer may be interposed between the first member 510 and the second member 520.

Heat generated in the display panel 400 may be efficiently dissipated by the first heat dissipation structure 500. In addition, by absorbing an external impact to the display device 100 by the first heat dissipation structure 500, the rigidity of the display device 100 may be supplemented, so that damage therefrom may be prevented.

The heat dissipation member (or the second heat dissipation layer) 600 and a third adhesive layer 330 may be additionally disposed in the display device 100 in addition to the first heat dissipation structure 500. By disposing the heat dissipation member 600 and the third adhesive layer 330, heat dissipation efficiency may be increased, and rigidity may be further supplemented.

The heat dissipation member (or the second heat dissipation layer) 600 may dissipate heat received from the first heat dissipation structure 500. The heat dissipation member 600 may be formed of a material having higher thermal conductivity than that of the first member 510. For example, the heat dissipation member 600 may be formed of graphite and is not limited to such a material.

The third adhesive layer 330 may be disposed on the heat dissipation member 600. The third adhesive layer 330 may cover the heat dissipation member 600 and absorb an external impact to the display device 100. The third adhesive layer 330 may be an embossing layer or a cushioning layer and is not limited to the term. For example, the third adhesive layer 330 may have a thickness of 60 μm and an adhesive strength of 1,000 gf, but is not limited thereto.

The heat dissipation member 600 may be formed of a graphite material. Graphite is lightweight and slim, and has excellent thermal conductivity compared to aluminum (Al) or copper (Cu). For example, heat diffusivity in a plane direction is three times or more that of copper. Graphite has heat dissipation characteristics in a lateral direction (or an X-axis direction) in addition to heat dissipation characteristics in a longitudinal direction (or a Z-axis direction), so that it has higher heat conduction efficiency compared to aluminum (Al) or copper (Cu). Graphite cannot be used alone and is used with a protective film due to conductivity and dust generation possibility.

With reference to FIG. 3, the heat dissipation member 600 may have a smaller width than that of the front member 200. An encapsulation member (or a sealing layer) 340 may encapsulate (or seal) the heat dissipation member 600 at upper and lower portions thereof. The encapsulation member 340 may remove the conductivity and dust generation possibility of the heat dissipation member 600.

The encapsulation member 340 may be formed of two planar layers (or sheets) to encapsulate the heat dissipation member 600 at respective upper and lower surfaces of the heat dissipation member 600. The encapsulation member 340 may be bonded to the third adhesive layer 330 disposed on the encapsulation member 340, and may be bonded to the second member 520 disposed under the encapsulation member 340. For example, each of the two planar layers of the encapsulation member 340 may be formed of a material having adhesive properties at both surfaces thereof. For example, the encapsulation member 340 may have a thickness of 5 to 10 μm, and an adhesive strength of 500 to 600 gf, but is not limited thereto.

The encapsulation member 340 may be configured of a first region (or a sealing portion) R1 that encapsulates (or seals) the heat dissipation member 600 between the two planar layers and a second region (or a wing portion) R2 where the two planar layers are directly bonded to each other. Accordingly, at least one region or all regions of the heat dissipation member 600 may be encapsulated with the encapsulation member 340.

According to an embodiment of the present disclosure, the first and second heat dissipation structures 500 and 700 may be formed to be smaller than a size of the display panel 400. When the first and second heat dissipation structures 500 and 700 are formed to be larger than the display panel 400, the non-active area may be increased. Accordingly, the size of the first and second heat dissipation structures 500 and 700 may be formed to be smaller than the size of the display panel 400 so that the non-active area does not increase. As an example, when the first and second heat dissipation structures 500 and 700 are formed to be smaller than the size of the display panel 400, a weight of the display device 100 may be reduced and manufacturing costs may be reduced, but a heat dissipation function and an impact absorption function may be lowered.

Also, when the first and second heat dissipation structures 500 and 700 are formed to be smaller than the display panel 400, a step is generated between the first and second heat dissipation structures 500 and 700 and the display panel 400, and at an end portion of the display panel 400 at which the step is formed.

The display device 100 may be configured such that a portion of an area of the display panel 400 has a curved surface. With reference to FIGS. 1 to 2, the front member 200 may have curved areas CA and a planar area PA.

The front member 200 may be a cover glass, a cover window, or tempered glass, and the like, but is not limited to the term. The curved area CA may be disposed at one end or both ends of the front member 200 in a first direction (or an X-axis direction). A radius of curvature of the curved area CA may not have a fixed value.

The display device 100 according to an embodiment of the present disclosure may have curved areas CA at the both ends of the front member 200. Values of the respective radii of curvature of the curved areas CA at the both ends may be different from each other.

With reference to FIG. 2, components disposed on an upper portion of the front member 200 may be affected by a shape of the front member 200. For example, the display panel 400, the first member 510, the second member 520, and the heat dissipation member 600 that are disposed in the planar area PA of the front member 200 may have a planar shape, and the display panel 400, the first member 510, the second member 520, and the heat dissipation member 600 that are disposed in the curved area CA of the front member 200 may have a curved shape.

The display panel 400, the first member 510, the second member 520, and the heat dissipation member 600 that are disposed in the curved area CA of the front member 200 may maintain a curved shape by adhesive strength of the first adhesive layer 310, the second adhesive layer 320 and the encapsulation member 340. The display panel 400, the first member 510, the second member 520, and the heat dissipation member 600 may have restoring force (or elastic force) due to material properties of the respective components. The restoring force can also be affected by thicknesses of the respective components. For example, as the thicknesses of the respective components increase, the restoring force may increase.

Adhesive force and restoring force act in opposite directions. For example, the adhesive force is directed to an outside of an arc formed by the curved area CA, and the restoring force is directed to an inside of the arc formed by the curved area CA. When the adhesive force is greater than the restoring force, the respective components may maintain a state in which they are bonded to the curved area CA. If the restoring force is greater than the adhesive force, the respective components may not be able to maintain the state in which they are bonded to the curved area CA. For example, at least one of the first adhesive layer 310, the second adhesive layer 320, and the encapsulation member 340 may delaminated without maintaining a bonding state.

Figure 4:
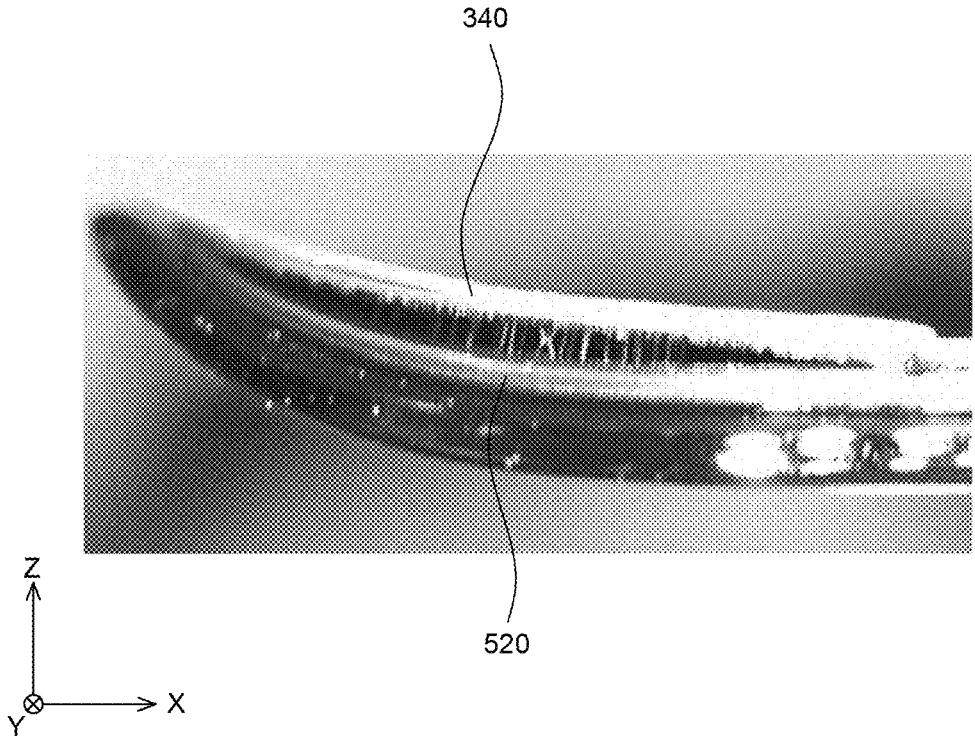
FIG. 4 is a real photograph of a cross-sectional view according to FIG. 2.

FIG. 4 is a real photograph of a cross-sectional view according to FIG. 2.

With reference to FIG. 4, it can be observed that adhesion is maintained between the display panel 400 and the first heat dissipation structure 500 on the curved area CA of the front member 200 by the first adhesive layer 310 and the second adhesive layer 320, respectively. However, a phenomenon (a lifting phenomenon) in which adhesion is not maintained and lifting occurs between the first heat dissipation structure 500 and the encapsulation member 340 may be observed.

The encapsulation member 340 may include two planar layers to encapsulate or seal the heat dissipation member 600 at the respective upper and lower surfaces of the heat dissipation member 600. Each of the two planar layers of the encapsulation member 340 may be formed of a material having adhesive properties at both surfaces thereof. The encapsulation member may be configured of a first region or a sealing portion R1 that encapsulates or seals the heat dissipation member 600 between the two planar layers and a second region or a wing portion R2 where the two planar layers are directly bonded to each other.

A position where the lifting phenomenon of the encapsulation member 340 occurs may be a position within the curved area CA. For example, the lifting phenomenon of the encapsulation member 340 may occur in the second region R2 in the curved area CA. The lifting phenomenon of the encapsulation member 340 may be caused by weak adhesive strength of the encapsulation member 340 itself and a step shape at a boundary between the first region R1 and the second region R2 of the encapsulation member 340, but the causation of the phenomenon is not limited thereto.

By reducing the first region R1 in which the encapsulation member 340 encapsulates the heat dissipation member 600, for example, by reducing a width of the heat dissipation member 600, the step shape at the boundary between the first region R1 and the second region R2 may be moved from the curved area CA to the planar area PA. Accordingly, the lifting phenomenon of the encapsulation member 340 may be reduced, but the heat dissipation performance may decrease as an area of the heat dissipation member 600 is reduced.

The lifting phenomenon may be eliminated by supplementing the adhesive strength of the encapsulation member 340. As a method of supplementing the adhesive strength of the encapsulation member 340, a method of strengthening the adhesive strength of the encapsulation member 340 itself (or a first method) and a method of strengthening the adhesive strength from an outside of the encapsulation member 340 (or a second method) may be available. In the first method, a thickness of the encapsulation member 340 and encapsulation function thereof may vary based on an adhesive material used in the adhesive layer.

The inventors of the present disclosure have conducted several experiments to enhance the adhesive strength from the outside of the encapsulation member 340. Through various experiments, a display device having a new structure capable of reinforcing adhesive strength without changing properties of the encapsulation member 340 has been realized as will now be described herein.

Figure 5:
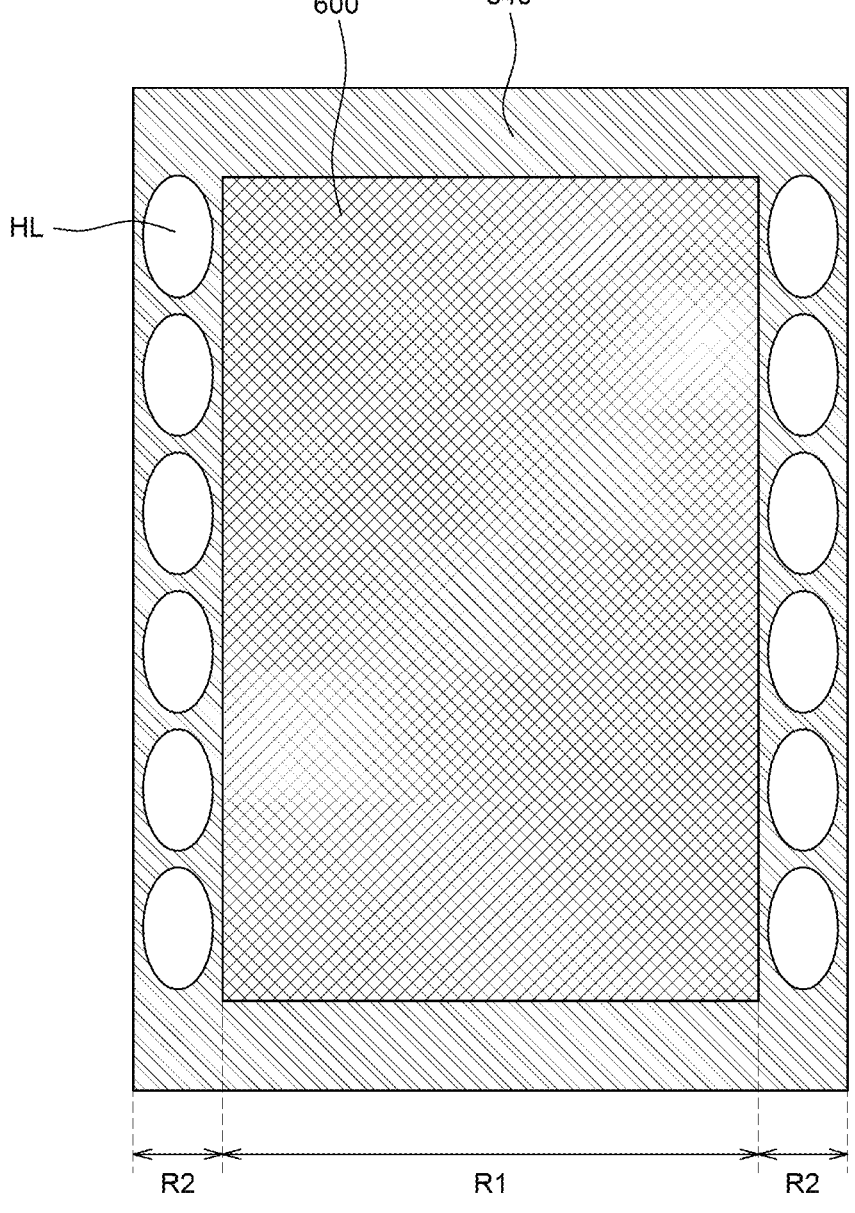
FIG. 5 is a plan view of an encapsulation member according to an embodiment of the present disclosure.
Figure 6:
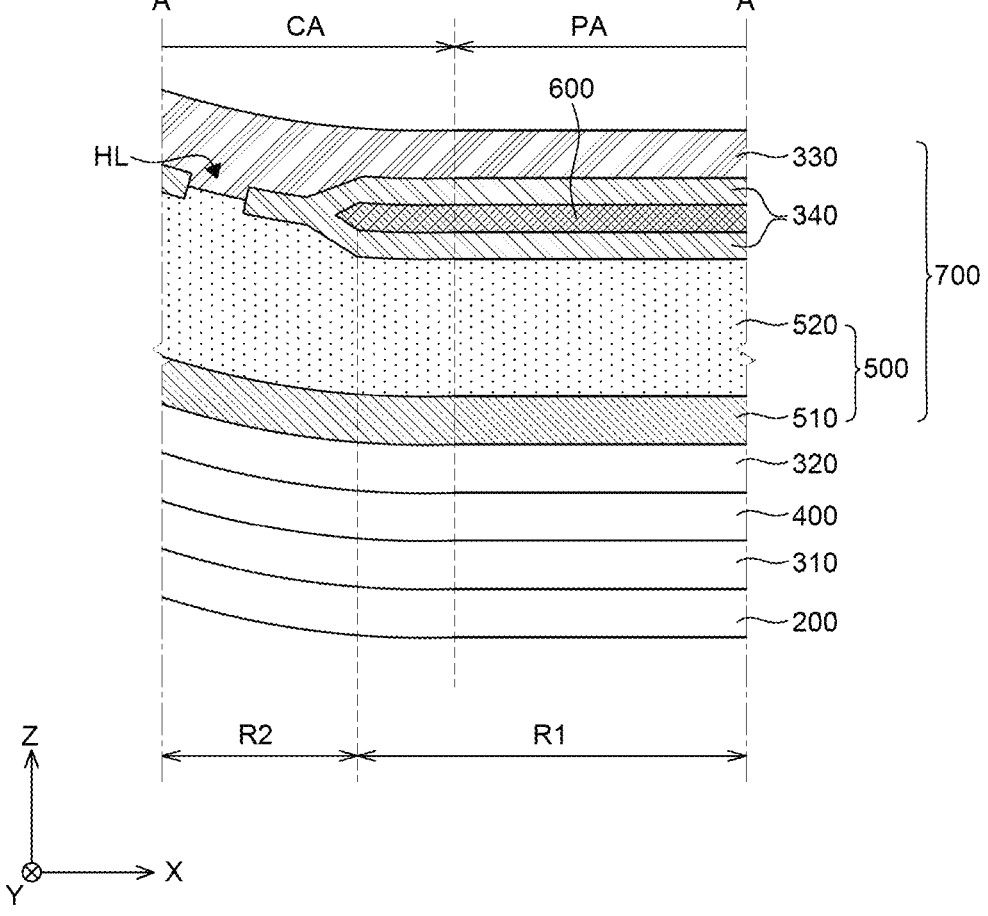
FIG. 6 is an enlarged view of cross-section A-A' of FIG. 2 according to an embodiment of the present disclosure.

FIG. 5 is a plan view of an encapsulation member according to an embodiment of the present disclosure, and FIG. 6 is an enlarged view of cross-section A-A' of FIG. 2 according to an embodiment of the present disclosure.

With reference to FIG. 5, the display device 100 according to an embodiment of the present disclosure may have a plurality of holes formed in the second region R2 of the encapsulation member 340. With reference to FIG. 6, the display device 100 according to an embodiment of the present disclosure may include the front member 200, the first adhesive layer 310, the display panel 400, the second adhesive layer 320, the first member 510, the second member 520, the encapsulation member 340 that encapsulates the heat dissipation member 600, and the third adhesive layer 330. Here, the same or similar components to those of FIG. 3 will be briefly described.

With reference to FIGS. 5 and 6, the encapsulation member 340 may be formed of two planar layers to encapsulate or seal the heat dissipation member 600 at the respective upper and lower surfaces of the heat dissipation member 600. Each of the two planar layers of the encapsulation member 340 may be formed of a material having adhesive properties at both surfaces thereof. For example, the encapsulation member 340 may have a thickness of 5 to 10 μm, and an adhesive strength of 500 to 600 gf, but is not limited thereto. The encapsulation member may be configured of a first region (or a sealing portion) R1 that encapsulates (or seals) the heat dissipation member 600 between the two planar layers and a second region (or a wing portion) R2 where the two planar layers are directly bonded to each other.

The encapsulation member 340 may have a plurality of holes HL in the second region R2. The third adhesive layer 330 may be directly bonded to the second member 520 through the plurality of holes HL in the second region R2. The adhesive strength of the third adhesive layer 330 may be 1,000 gf, and the adhesive strength of the encapsulation member 340 may be 500 to 600 gf. Since the adhesive strength of the third adhesive layer 330 is higher than that of the encapsulation member 340, force by which the third adhesive layer 330 is bonded to the second member 520 through the plurality of holes HL may be stronger than force by which the encapsulation member 340 is bonded to the second member 520. Accordingly, the lifting phenomenon between the encapsulation member 340 and the second member 520 may be resolved by supplementing the adhesive strength of the encapsulation member 340 to the second member 520.

With reference to FIG. 6, the front member 200 may be configured to have a curved area CA and a planar area PA. The curved area CA may be disposed at one end or both ends of the front member 200 in the first direction (or the X-axis direction). The values of the respective radii of curvature of the curved areas CA at the both ends may be different from each other.

The display panel 400 may be bonded to the rear surface of the front member 200. For example, the display panel 400 may be bonded to the front member 200 by the first adhesive layer 310.

The first member or the first heat dissipation layer 510 may be disposed on the display panel 400. The first member 510 may be disposed under the display substrate constituting the display panel 400 and supplement rigidity of the display substrate. The first member 510 may absorb heat generated from the display panel 400 and transfer the heat to other mediums.

The second adhesive layer 320 may be disposed between the display panel 400 and the first member 510. The second adhesive layer 320 may bond the display panel 400 and the first member 510 to each other. The second adhesive layer 320 may transfer heat generated from the display panel 400 to the first member 510.

The second member or the first cushioning layer 520 may be disposed on the first member 510. The second member 520 may have a heat dissipation function and an impact absorption function. The second member 520 may receive heat generated in the display panel 400 from the first member 510 and transfer it to other mediums. The second member 520 may absorb an external impact applied to the display panel 400 and reduce the impact transmitted to the display panel 400.

The heat dissipation member or the second heat dissipation layer 600 may be disposed on the second member 520. The heat dissipation member 600 may dissipate heat received from the second member 520. The heat dissipation member 600 may be formed of a graphite material.

The encapsulation member or the sealing layer 340 may be formed of two planar layers to encapsulate the heat dissipation member 600 at respective upper and lower surfaces of the heat dissipation member 600. The encapsulation member 340 may remove conductivity and dust generation possibility of the heat dissipation member 600. Each of the two planar layers of the encapsulation member 340 may be formed of a material having adhesive properties at both surfaces thereof. The adhesive strength of the encapsulation member 340 may be 500 to 600 gf, but is not limited thereto.

The encapsulation member 340 may be configured to include a first region or a sealing portion R1 that encapsulates or seals the heat dissipation member 600 between the two planar layers and a second region or a wing portion R2 where the two planar layers are directly bonded to each other. Accordingly, at least one region or all regions of the heat dissipation member 600 may be encapsulated with the encapsulation member 340. The encapsulation member 340 may have the plurality of holes HL in at least some portions of the second region R2.

The third adhesive layer 330 may be disposed on the heat dissipation member 600. The third adhesive layer 330 may cover the heat dissipation member 600 and absorb an external impact to the display device 100. The adhesive strength of the third adhesive layer 330 may be 1,000 gf, but is not limited thereto.

In the display device according to an embodiment of the present disclosure, to strengthen adhesive strength between components in the curved area CA, for example, to supplement adhesive strength between the second member 520 and the encapsulation member 340, the second region R2 of the encapsulation member 340 may have the plurality of holes HL.

The third adhesive layer 330 and the second member 520 may be directly bonded to each other through the plurality of holes HL. For example, the adhesive strength of the third adhesive layer 330 may be 1,000 gf, and the adhesive strength of the encapsulation member 340 may be 500 to 600 gf, but is not limited thereto. Since the adhesive strength of the third adhesive layer 330 is higher than that of the encapsulation member 340, force by which the third adhesive layer 330 is bonded to the second member 520 through the plurality of holes HL may be stronger than force by which the encapsulation member 340 is bonded to the second member 520. Accordingly, the lifting phenomenon between the encapsulation member 340 and the second member 520 may be resolved by supplementing the adhesive strength of the encapsulation member 340 to the second member 520. Accordingly, by improving adhesion performance between components in the curved area CA, it is possible to provide the display device 100 in which reliability can be improved.

The encapsulation member 340 may have a width equal to or smaller than that of the front member 200. An area of the second region R2 of the encapsulation member 340 may be affected by an area of the first region R1, for example, an area occupied by the heat dissipation member 600. The area of the second region R2 may be divided into an area of a region in which the plurality of holes HL are formed and an area of a region in which the plurality of holes HL are not formed. The area of the region in which the plurality of holes HL are formed may be affected by a shape and an interval of the plurality of holes HL. For example, an area where the third adhesive layer 330 is bonded to the second member 520 may be affected by the shape and interval of the plurality of holes HL. In addition, an area where the third adhesive layer 330 and the second member 520 are bonded may be affected by a height of the encapsulation member 340 in the second region R2.

The plurality of holes HL may have a circular or polygonal shape. The area of the plurality of holes HL may be adjusted by adjusting the circular or polygonal shape of the plurality of holes HL. Accordingly, by allowing a force obtained by adding the adhesive strength of the encapsulation member 340 to the second member 520 and the adhesive strength of the third adhesive layer 330 to the second member 520 to be stronger than the restoring force of the heat dissipation member 600 or the encapsulation member 340, it is possible to remove the lifting phenomenon.

The plurality of holes HL may be disposed side by side at the same interval between one another. The area of the plurality of holes HL may be adjusted by adjusting the interval between the plurality of holes HL. Accordingly, by allowing a force obtained by adding the adhesive strength of the encapsulation member 340 to the second member 520 and the adhesive strength of the third adhesive layer 330 to the second member 520 to be stronger than the restoring force of the heat dissipation member 600 or the encapsulation member 340, it is possible to remove the lifting phenomenon.

Figure 7:
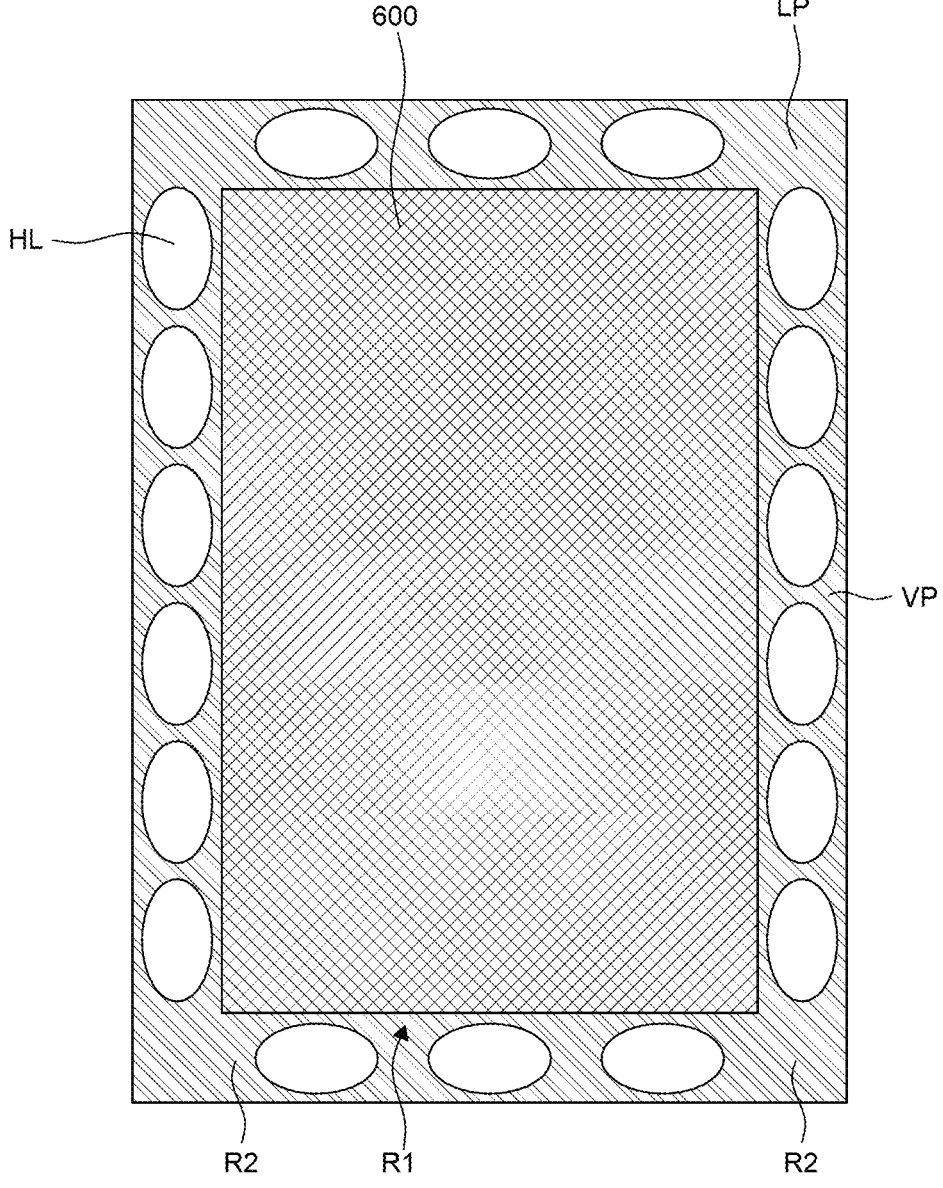
FIG. 7 is a plan view of an encapsulation member according to an embodiment of the present disclosure.

FIG. 7 shows an embodiment where encapsulation member 340 includes holes HL on all portions of the edge or second region R2 that surrounds the first portion R1. The holes HL disposed on different portions of the second region R2 may include same structural configurations, e.g., in the shapes and intervals, or may include different structural configurations. For example, with respect to the example shown in FIG. 7, holes in the lateral portion LP of the second region R2 may include different intervals between one another from the holes in the vertical portion VP of the second region R2. The embodiment of FIG. 7 can be used in display devices that have curved portions on all four edges thereof, e.g., the display devices used in some mobile devices.

Figure 8:
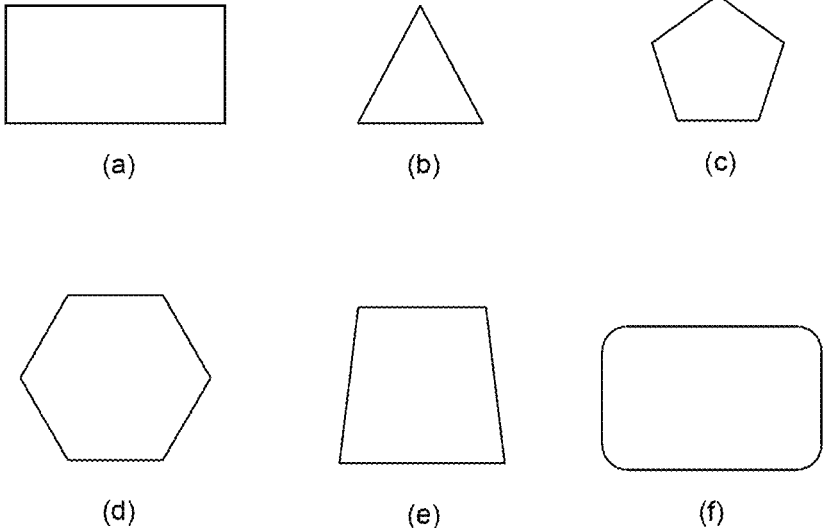
FIG. 8 shows example shapes of holes in an encapsulation member according to embodiments of the present disclosure.

FIG. 8, shows examples of the polygonal shapes of the holes HL. For example, holes HL may have a shape of a rectangle 8(*a*), a triangle 8(*b*), a pentagon 8(*c*), a hexagon 8(*d*), or a trapezoid 8(*e*). The holes HL may also have substantially a polygonal shape with rounded corners, as shown in 8(*f*). The holes HL may also have other polygonal shapes or other shapes, which are all included in the scope of the disclosure. In some embodiments, an encapsulation member may include holes HL of different shapes in different areas or regions of the encapsulation member. For the shapes of the embodiments of FIG. 8, the corners of each shape, namely, the portion where adjacent edges meet, can be rounded or have an arc rather than be a sharp transition, for example, rounded in the corners instead of being at 120°, 90°, 72°, or the like. This will aid to prevent crease when both the lateral edge and the upper/lower edge are bent. The holes HL of FIGS. 5 and 7 are similarly rounded at the transitions.

The embodiments of the present disclosure can also be described as follows:

The display device according to an embodiment of the present disclosure comprises, a front member disposed on a front surface of a display panel and having curved areas and a planar area, a second adhesive layer disposed on a rear surface of the display panel, a first member disposed on the second adhesive layer, a second member disposed on the first member, a heat dissipation member disposed on the second member and having a width different from that of the front member, an encapsulation member encapsulating the heat dissipation member and including a first region and a second region and a third adhesive layer disposed on the heat dissipation member, wherein the curved areas are located at both ends of the front member along a width direction of the front member, wherein a width of the encapsulation member is less than or equal to a width of the front member.

The heat dissipation member may be encapsulated in the first region of the encapsulation member.

According to some embodiments of the present disclosure, the second region of the encapsulation member may include a plurality of holes.

According to some embodiments of the present disclosure, the plurality of holes may be disposed side by side at a same interval.

According to some embodiments of the present disclosure, the plurality of holes may have a circular shape or a polygonal shape.

According to some embodiments of the present disclosure, the third adhesive layer and the second member may be in contact with each other in the plurality of holes.

According to some embodiments of the present disclosure, the first member may include a metal.

According to some embodiments of the present disclosure, the display device may further include a first adhesive layer between the display panel and the front member.

According to some embodiments of the present disclosure, the heat dissipation member may have a width smaller than that of the front member.

According to an embodiment of the present disclosure, a display device comprises a front member having a curved area and a planar area, a first adhesive layer disposed on a rear surface of the front member, a display panel disposed on the first adhesive layer, a second adhesive layer disposed on the display panel, a first heat dissipation layer disposed on the second adhesive layer and including a metal, a first cushioning layer disposed on the first heat dissipation layer, a second heat dissipation layer disposed on the first cushioning layer and having a width different from that of the front member, an encapsulation layer having an encapsulation portion that encapsulates a front surface of the second heat dissipation layer and a wing portion and a third adhesive layer disposed on the second heat dissipation layer, wherein the first cushioning layer and the third adhesive layer are in contact with each other through a plurality of holes formed in the wing portion of the encapsulation layer.

According to some embodiments of the present disclosure, the plurality of holes may have a circular or polygonal shape, and the plurality of holes may be disposed at a same interval.

According to some embodiments of the present disclosure, the wing portion may be adjacent to one side of the curved area and disposed within the curved area.

According to some embodiments of the present disclosure, the second heat dissipation layer may have a width smaller than that of the front member.

It will be apparent to those skilled in the art that various modifications and variations can be made in the present disclosure without departing from the technical idea or scope of the disclosures. Thus, it is intended that the present disclosure covers the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a front member disposed over a front surface of a display panel and having curved areas and a planar area;
   a second adhesive layer disposed on a rear surface of the display panel;
   a first member disposed on the first adhesive layer;
   a second member disposed on the first member;
   a heat dissipation member disposed over the second member and having a width different from a width of the front member;
   an encapsulation member encapsulating the heat dissipation member and including a first region and a second region; and
   a third adhesive layer disposed over the heat dissipation member,
   wherein the curved areas are located at both ends of the front member along a width direction of the front member, and
   wherein a width of the encapsulation member is different from the width of the front member.

2. The display device of claim 1, wherein the width of the encapsulation member is less than the width of the front member.

3. The display device of claim 1, wherein the heat dissipation member is encapsulated in the first region of the encapsulation member.

4. The display device of claim 3, wherein the second region of the encapsulation member includes a plurality of holes.

5. The display device of claim 4, wherein the plurality of holes are disposed side by side at a same interval between one another.

6. The display device of claim 4, wherein the plurality of holes each have a circular shape or a polygonal shape.

7. The display device of claim 4, wherein the third adhesive layer and the second member are in contact with each other in the plurality of holes.

8. The display device of claim 1, wherein the first member includes a metal.

9. The display device of claim 1, further comprising a first adhesive layer between the display panel and the front member.

10. The display device of claim 1, wherein the width of the heat dissipation member is smaller than the width of the front member.

11. A display device, comprising:
   a front member having a first portion and a second portion;
   a display panel over a back surface of the front member;
   a cushioning layer over the display panel;
   a heat dissipation member over the cushioning layer, overlapping the first portion, and being offset from the second portion of the front member;
   an adhesive layer over the heat dissipation layer; and
   an encapsulation layer including a first part and a second part, the first part including a first layer and a second layer, the first layer between the heat dissipation member and the cushioning layer, the second layer between the heat dissipation member and the adhesive layer, and the second part between the cushioning layer and the adhesive layer without the heat dissipation member.

12. The display device of claim 11, wherein the encapsulation layer includes at least one hole in the second part, and wherein the cushioning layer and the adhesive layer are in contact with each other through the at least one hole.

13. The display device of claim 12, wherein the at least one hole includes a hole having a circular shape.

14. The display device of claim 12, wherein the at least one hole includes a hole having a polygonal shape.

15. The display device of claim 11, wherein the heat dissipation member includes graphite.

16. The display device of claim 11, wherein the first portion includes a planar portion and a curved portion, and wherein the heat dissipation member overlaps the curved portion of the first portion.

17. The display device of claim 16, wherein the second portion is curved.

* * * * *